United States Patent [19]

Jablonski et al.

[11] Patent Number: 5,226,947

[45] Date of Patent: Jul. 13, 1993

[54] NIOBIUM-TITANIUM SUPERCONDUCTORS PRODUCED BY POWDER METALLURGY HAVING ARTIFICIAL FLUX PINNING CENTERS

[75] Inventors: Paul D. Jablonski; David C. Larbalestier, both of Madison, Wis.

[73] Assignee: Wisconsin Alumni Research Foundation, Madison, Wis.

[21] Appl. No.: 837,038

[22] Filed: Feb. 17, 1992

[51] Int. Cl.$^5$ ............................................. C22C 14/00
[52] U.S. Cl. .................................. 75/245; 252/518; 252/520; 420/426; 420/901; 505/806; 428/547; 419/23; 419/39
[58] Field of Search ............. 419/3, 6, 23, 29, 39; 75/245; 420/901, 426; 252/518, 520; 428/558, 505/704, 800, 806, 785

[56] References Cited

U.S. PATENT DOCUMENTS

| | | | |
|---|---|---|---|
| 3,124,455 | 3/1964 | Buehler et al. | 428/558 |
| 3,275,480 | 9/1966 | Betterton, Jr. et al. | 420/901 |
| 3,290,186 | 12/1966 | Rosi et al. | 420/901 |
| 3,310,398 | 3/1967 | Kneip, Jr. | 420/901 |
| 3,325,888 | 6/1967 | Weinig | 29/599 |
| 3,429,032 | 2/1969 | Martin et al. | 29/599 |
| 3,448,062 | 6/1969 | Alden et al. | 252/520 |
| 3,466,237 | 9/1969 | Barber | 204/181.5 |
| 3,472,705 | 10/1969 | Gregory | 148/11.5 R |
| 3,496,622 | 2/1970 | Berghout et al. | 420/901 |
| 3,525,150 | 8/1970 | Deiness | 29/599 |
| 3,615,881 | 10/1971 | Greene | 148/4 |
| 3,676,577 | 7/1972 | Martin et al. | 174/119 R |
| 3,713,898 | 1/1973 | Giorgi et al. | 148/126 |
| 3,817,746 | 6/1974 | Tsuei | 420/901 |
| 3,930,903 | 1/1976 | Randall et al. | 148/32 |
| 4,008,079 | 2/1977 | Bowers | 148/400 |
| 4,050,147 | 8/1977 | Winters et al. | 29/599 |
| 4,336,065 | 6/1982 | Bergmann et al. | 75/200 |
| 4,363,675 | 12/1982 | Yoshizaki | 148/11.5 P |
| 4,386,970 | 6/1983 | Fukutsuka et al. | 148/11.5 P |
| 4,402,768 | 9/1983 | Flukiger | 148/11.5 F |
| 4,411,959 | 10/1983 | Braginski et al. | 428/558 |
| 4,594,218 | 6/1986 | Dubots et al. | 419/4 |
| 4,687,883 | 8/1987 | Flukiger et al. | 174/126 S |
| 4,704,169 | 11/1987 | Kimura et al. | 148/403 |
| 4,717,627 | 1/1988 | Nellis et al. | 428/552 |
| 4,746,581 | 5/1988 | Flukiger | 428/614 |
| 4,803,310 | 2/1989 | Zeitlin et al. | 174/128 S |
| 4,863,804 | 8/1989 | Whitlow et al. | 428/555 |

FOREIGN PATENT DOCUMENTS

| | | | |
|---|---|---|---|
| 0025558 | 10/1968 | Japan | 420/901 |
| 0025559 | 10/1968 | Japan | 420/901 |
| 0105215 | 6/1984 | Japan | 420/901 |
| 0170110 | 9/1985 | Japan | 420/901 |

OTHER PUBLICATIONS

G. L. Dorofejev, et al., "Current-Carrying Capacity of Superconductors With Artificial Pinning Centers," Proc. 9th International Conf. on Magnet Tech., Boston, Mass., 1985, pp. 564–566.

J. M. Seuntjens, et al., "Development of In Situ Second Phase Pinning Structure in Niobium-Titanium Based Supercond. Alloys," Submitted IEEE MAG 90.

G. Steijic, et al., "Numerical Calculation of Flux Pinning by α-Ti Precipitates in Nb-Ti," submitted to Supercond. Sci. Tech.

J. M. Seuntjens and D. C. Larbalestier, "Development of In Situ Second Phase Pinning Structure in Niobium-Titanium Based Superconducting Alloys," IEEE Transactions on Magnetics, vol. 27, No. 2, Mar. 1991, pp. 1120–1124.

*Primary Examiner*—Donald P. Walsh
*Assistant Examiner*—Ngoclan T. Mai
*Attorney, Agent, or Firm*—Foley & Lardner

[57] ABSTRACT

Superconductors formed by powder metallurgy have a matrix of niobium-titanium alloy with discrete pinning centers distributed therein which are formed of a compatible metal. The artificial pinning centers in the Nb-Ti matrix are reduced in size by processing steps to sizes on the order of the coherence length, typically in the range of 1 to 10 nm. To produce the superconductor, powders of body centered cubic Nb-Ti alloy and the second phase flux pinning material, such as Nb, are mixed in the desired percentages. The mixture is then isostatically pressed, sintered at a selected temperature and selected time to produce a cohesive structure having desired characteristics without undue chemical reaction, the sintered billet is reduced in size by deformation, such as by swaging, the swaged sample receives heat treatment and recrystallization and additional swaging, if necessary, and is then sheathed in a normal conducting sheath, and the sheathed material is drawn into a wire. The resulting superconducting wire has second phase flux pinning centers distributed therein which provide enhanced $J_{ct}$ due to the flux pinning effects.

16 Claims, 7 Drawing Sheets

FIG. 10
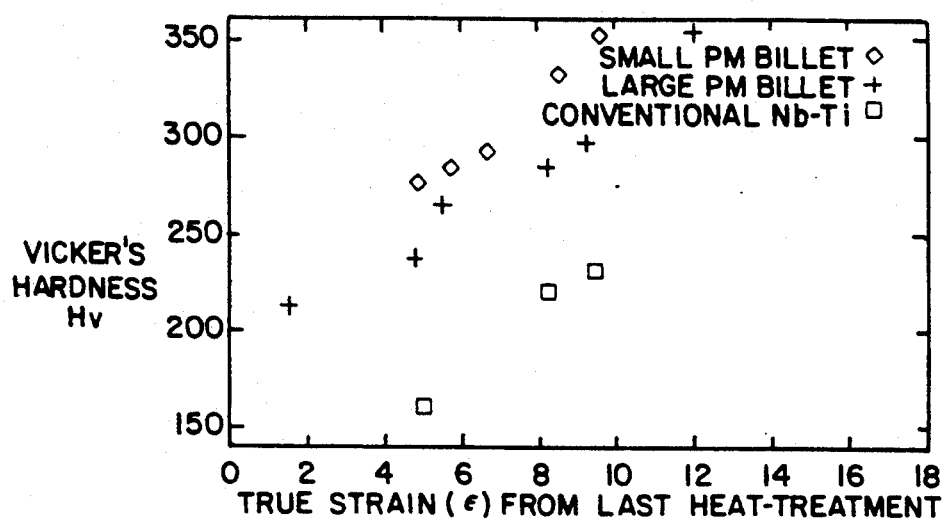
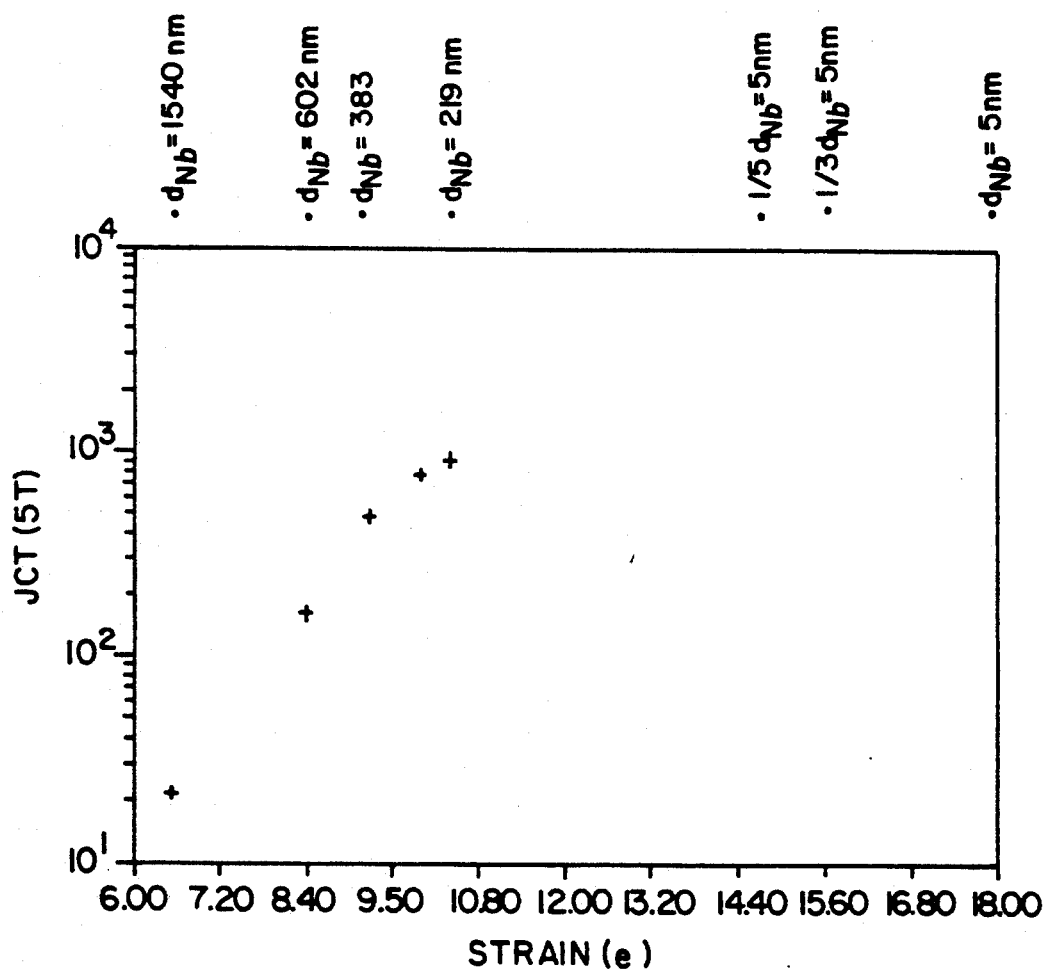
FIG. 11

NIOBIUM-TITANIUM SUPERCONDUCTORS PRODUCED BY POWDER METALLURGY HAVING ARTIFICIAL FLUX PINNING CENTERS

This invention was made with United States government support awarded by the Department of Energy (DOE), Grant # DE-AC02-82ER40077 Case No. S-76,914. The U.S. Government has certain rights in this invention.

FIELD OF THE INVENTION

This invention pertains generally to the field of superconducting materials and methods for producing superconductors and particularly to superconductors produced by powder metallurgy.

BACKGROUND OF THE INVENTION

Niobium-titanium (Nb-Ti) alloys remain the most widely used superconductors, having applications ranging in scale from small laboratory magnets to large scale high energy magnets such as those used in the superconducting supercollider. This leadership position remains despite several alternative materials with higher $T_c$ and $B_{c2}$, such as the A-15 compounds (chiefly $Nb_3Sn$) and more recently the cuperate oxide superconductors. The main reason for the wide continued use of Nb-Ti is the ease of fabrication of materials which retain technologically interesting and useful $T_c$, $B_{c2}$ and $J_c$. Most conventional Nb-Ti alloys are designed in the range of 44-50 wt. % Ti. This range contains the peak in $H_{c2}$ and $T_c$. Most attempts to optimize this alloy have been made near the Nb-46.5 wt. % Ti composition. The present best $J_{ct}$ at 5 Tesla (5T) in a conventional wire is around 3700 A/mm². This wire was developed by matching second phase α-Ti precipitates (which are produced by conventional nucleation and growth techniques) to the fluxon size and spacing. It has been observed that $J_{ct}$ is proportional to the percent of α-Ti precipitates. However, 20-25% precipitate is about the maximum which can be developed in this alloy. This apparent limit on volume percent precipitate has currently limited further increases in $J_{ct}$.

Various attempts have been made to avoid this limitation by introducing the second phase artificially, and the conductors formed in this manner have been described as artificial pinning center (APC) conductors. Typically, these APC conductors incorporate normal metal rods or tubes in the superconducting matrix of a composite microstructure. Handling considerations generally require that the second phase be quite large. A difficulty is encountered in that the composite then requires a large amount of strain to reduce the second phase to a size comparable to the coherence length, about 5 nm at 4.2K, and therefore strains on the order of 30 are required for some APC conductors versus about 12 to 16 to fully develop conventional Nb-Ti. However, if the initial size of the second phase is on the order of tens of microns, and the ingot diameter is small, the strain needed is only on the order of 16 to 17. Powder metallurgy (PM) can introduce a micron sized second phase in a truly random manner, and allows for greater flexibility in second phase size distribution, volume fraction and chemistry.

However, difficulties are encountered when attempting to produce Nb-Ti alloys using powder metallurgy techniques. First, the starting powders invariably have a higher interstitial content (higher N, O, H and C) than bulk material. These interstitials can harden the alloy to such an extent that it is no longer possible to process the ingot into wire. This limitation exacerbates the basic process of sintering in which sintering efficiency is traded off against reactivity, i.e., processes which produce greater densification generally introduce more interstitials.

A Type II superconductor such as Nb-Ti alloy may carry resistanceless current throughout its bulk and thus can achieve much higher current densities than a Type I superconductor. In a Type II superconductor, the appearance of a voltage across the superconductor is not necessarily an indication that the sample has gone normal, but rather is an indication of the movement of fluxons under the influence of the Lorentz force. Thus, flux pinning becomes an important issue in increasing the current carrying capacity of Type II superconductors. Fluxons arise because the surface energy between the normal and superconducting regions is negative in Type II superconductors in fields above $H_{c1}$. A fluxon is characterized by a normal core which is threaded by a quanta of magnetic flux. Thus, fluxons repel each other, establishing a so-called flux line lattice. The magnetic field of the fluxon decays over the length of the penetration depth, and the superconductor is shielded from this magnetic field by circulating supercurrents. These currents are sustained by Cooper pair electrons which interact over the distance of the coherence length—the length over which superconductivity decays. Hence, the radius of the fluxon core is essentially the coherence length, which is about 5 nanometers (nm) at 4.2K.

It has been suggested that because precipitates in Nb-Ti are clustered, the size of the pinning centers (and, in fact, their physical makeup from a superconducting standpoint) may change with temperature due to the proximity effect. An extreme viewpoint is that the larger isolated α-Ti precipitates pin at lower temperatures while α-Ti precipitate clusters pin collectively at temperatures near $T_c$. With conventional Nb-Ti processing, clustering of the pinning centers is to some degree unavoidable.

SUMMARY OF THE INVENTION

In accordance with the present invention, superconductors formed by powder metallurgy have a matrix of niobium-titanium alloy with discrete pinning centers distributed therein which are formed of a compatible metal, examples of which include niobium, tungsten, tantalum and vanadium. The inclusions, providing artificial pinning centers in the Nb-Ti matrix, are preferably substantially randomly distributed as a consequence of the powder metallurgy processing, and are reduced in size by processing steps to sizes on the order of the coherence length, typically in the range of 1 to 10 nm. The distribution of the size of the discrete pinning centers is also preferably selected over a broad span to best match the range of fluxons to be encountered.

In the process of the present invention, powders of Nb-Ti alloy and the second phase flux pinning material, such as Nb, preferably having a size range in the 40 micron to 150 micron range, are mixed in the desired percentages. The Nb-Ti matrix alloy has a body centered cubic (bcc) crystal structure and has a preferred range from Nb-20 wt. % Ti to Nb-70 Wt. % Ti with possible small amounts of other elements. The second phase preferably comprises between 5% and 50% by volume of the total. The mixture is then isostatically pressed, sintered at a selected temperature and selected time to produce a cohesive structure having desired characteristics without undue chemical reaction, the sintered billet is reduced in size by deformation, such as by swaging, the swaged sample receives heat treatment and recrystallization by healing heat treatment, and then additional swaging if necessary. The material is then sheathed in a normal conducting sheath, such as that formed of copper, and the sheathed material is drawn into a wire. The swaging and drawing process produces strain in the composite material which reduces the particle size of the discrete pinning centers.

The resulting superconducting wire formed in accordance with the present invention has second phase flux pinning centers distributed therein which provide enhanced $J_c$ due to the flux pinning effects.

Further objects, features and advantages of the invention will be apparent from the following detailed description when taken in conjunction with the accompanying drawings.

BRIEF DESCRIPTION OF THE DRAWINGS

In the drawings:

FIG. 10 is a graph showing hardness vs. strain from the last recrystallization heat treatment for materials formed in accordance with the present invention by powder metallurgy and for an ingot metallurgy material.

FIG. 11 is a graph illustrating the relationship between $J_c$(5T) vs. filament strain, with the top of the diagram indicating the estimated $d_{Nb}$ at various strains as well as the strain at which $d_{Nb} = 5$ nm and estimates of strain at which $\frac{1}{3} d_{Nb} = 5$ nm and $1/5\ d_{Nb} = 5$ nm.

DETAILED DESCRIPTION OF THE INVENTION

Figure 1:
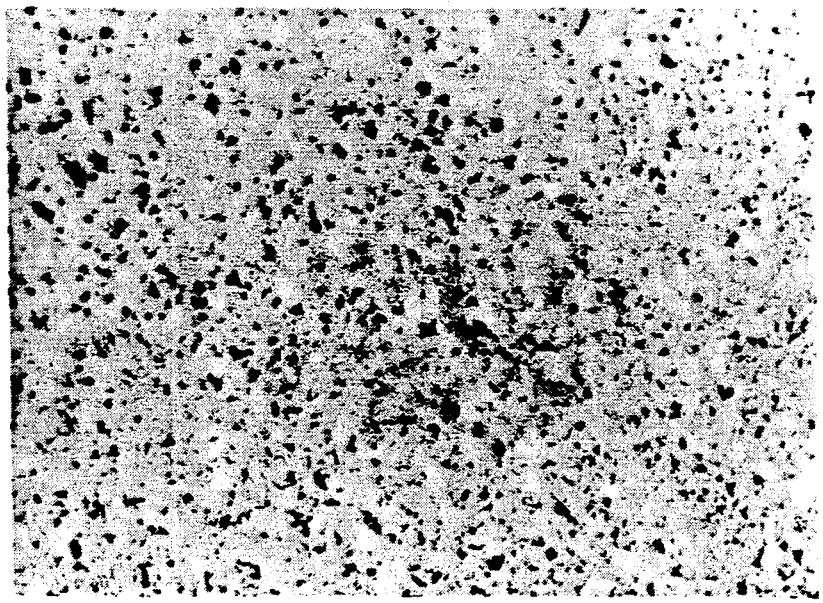
FIG. 1 is a photomicrograph at 100 magnification of a typical structure observed in an as-sintered material from the small diameter starting billet of the present invention after barrier etch.

Superconducting wires are formed in the present invention by powder metallurgy techniques on mixtures of niobium-titanium alloy powder and powders of a compatible metal second phase which are capable of acting as flux pinning centers. The Nb-Ti alloy of the matrix has a body centered cubic crystal structure with a preferred range from Nb-20 wt. % Ti to Nb-70 wt. % Ti. The matrix alloy may also possibly include minor additions of other elements, examples of which are Ta, V, Zr and Hf. Exemplary second phase materials include various body centered cubic crystalline metals, including niobium, titanium, molybdenum, chromium, copper, silver, gold, tungsten, tantalum, vanadium, zirconium and hafnium, with niobium being preferred, as well as alloys thereof. The basic requirement is that the second phase co-reduce with the Nb-Ti matrix so as to produce a fine dispersion and act as the pinning centers for the flux vortices while the matrix phase is in the superconducting state. To achieve these ends, proper preparation of the material by powder metallurgy techniques is essential.

The following summarizes the basic sintering concepts required for preparation of superconductors by powder metallurgy in the present invention and the sample reactivity considerations during sintering.

It is found that regardless of the type of sintering, the densification rate increases exponentially with increasing temperature. The sintering rate is very sensitive to particle size (especially for surface or grain boundary diffusion), with small particle size giving rapid sintering. However, sintering conditions which give rise to efficient densification generally tend to increase levels of interstitial contaminants. Even at vacuum levels of $10^{-6}$ Torr, a monolayer of gas molecules (mostly water) may be found on the powder particles. Consequently, with smaller particles more interstitial contaminants are introduced. In addition, the contamination is much higher for smaller particles because of the higher surface energy of such particles. Thus, while a smaller particle size leads to better sintering kinetics, it also produces more contamination in the final product. Furthermore, while an increase in sintering temperature increases the efficiency of sintering, increasing temperatures are also expected to increase specimen reactivity by increasing the driving force for the chemical reaction (that is, a higher $\Delta G$ of reaction) as well as increasing the reaction rate (chiefly by increasing the diffusivity and solubility of interstitials). Thus, in making ingots, sintering kinetics must be balanced against reactivity and contamination considerations.

The following provides specific exemplary illustrations of the process of the present invention with an initial starting powder comprised of a mixture of Nb-Ti alloy and a second phase consisting of 100% Nb. The volume percentage of the Nb second phase can vary over a significant range, preferably between 5% and 50% by volume of the total matrix and second phase, while still yielding the desired results. Table 1 below illustrates exemplary compositions with a matrix powder of Nb-46.5 wt. % Ti alloy with a second phase of niobium. The size of the Nb powder particles may also be varied. By controlling the starting Nb particle size and distribution, the resulting pinning center strength and distribution can be manipulated.

TABLE 1

| Overall Composition of Nb-46.5 wt % Ti + X vol % Nb | | |
|---|---|---|
| Vol % Nb | Overall (wt % Ti) | Density ($\rho$ [gm/cc]) |
| 5 | 43.3 | 6.15 |
| 10 | 40.1 | 6.28 |
| 20 | 34.2 | 6.54 |
| 30 | 29.8 | 6.79 |

As described by Seuntjens and Larbalestier, "Development of In Situ Second Phase Pinning Structure in Niobium-Titanium Base Superconducting Alloys," IEEE Transactions on Magnetics, Vol. 27, No. 2, March 1991, pp. 1120-1124, only certain select rare earth metals are both insoluble in and form no intermetallics with either niobium or titanium and thus are capable of providing artificial pinning centers by ingot metallurgy techniques. In the present invention, however, it is not necessary that the second phase be completely insoluble with the matrix inasmuch as powder metallurgy is utilized to form the material. For example, Nb is a suitable and preferred second phase material with a Nb-Ti alloy matrix because of the compatibility of Nb with the matrix, as well as its slow diffusivity at the sintering temperatures (diffusion distances have been estimated to be less than one micron for the typical thermal treatments given the PM ingots). Several other body centered cubic (BCC) elements are also suitable candidates. A variety of elements or alloys may be suitable as a second phase, with the basic requirement being that the second phase co-reduce with the matrix to produce a fine dispersion and to act as pinning centers for the flux vortices while the matrix is in the superconducting state.

The following summarizes the steps in the preferred PM ingot production in the present invention, with a more detailed description given further below.

The powders are initially weighed, blended and then poured into a rubber cold isostatic press (CIP) high pressure bag. The bag containing the powder is then pressed in a CIP. After the bag has been removed, the green composite is sintered under appropriate conditions. After sintering, small ingots (e.g., from half inch CIP bags) are reduced in size by deformation, such as by being swaged through several dies, after which any surface defects are preferably ground away. The large ingots (e.g., from one and one-half inch CIP bags) are initially too large and porous to be swaged through more than one or two dies before recrystallization/healing heat-treatment must be utilized. Consequently, a more moderate reduction and heat treatment schedule is used for the larger billet samples. After consolidation, the composite is heat treated (recrystallization/healing heat treatment) to bond the pore surfaces that were closed during the consolidation process. If necessary, the composite is swaged round, and if it is found to be free of surface defects, it is sheathed in copper and drawn into wire using standard techniques, producing about a 20% reduction per pass.

An initial exemplary production composite contained 20 vol. % Nb mixed with Nb-46.5 wt. % Ti powder. After sintering and heat treating processes, a small diameter ingot was sheathed in a thin walled Cu-30 wt. % Ni tube turned down from a hexagonal (OD)/round (ID tube), and the composite was subsequently swaged round and sheathed in OFHC Cu. The Cu-Ni tube was used for strength as well as for hardness compatibility with the superconductor. The composite resheathed in Cu was then drawn into wire.

After swaging/recrystallization/heal heat processing to about 0.290 in. diameter, the large diameter ingot was sheathed in a 0.050 in. wall Cu-30 wt. % Ni tube. This combination easily drew down to hex size (0.072 in.). A 60+1 (Cu hex) multifilamentary composite was made of this material incorporating a 0.049 in. thick Cu tube with Cu shims. A six inch length of this composite was salvaged and resheathed in a thicker wall Cu tube (T=0.060 in.) which was drawn down from 0.85 in. to 0.080 in. At this size, Cu draw-off leading into the die had become excessive. A section of 0.080 in. composite was recanned in a length of 0.050 in. wall Cu-30 wt. % Ni tube which had been drawn down. This hybrid composite was then drawn down and samples were taken as small as 0.007 in. Standard metallographic techniques for Nb-Ti specimens were used to mount and polish samples. The final polish was an attack polish incorporating a small charge of acid to help reduce scratches and produce a mirror finish. However, if the Nb particles were large (greater than about 10 microns), this standard technique led to these particles sticking above the polished surface, that is, the etch preferentially attacked the matrix. Therefore, attack polishing was largely avoided in samples which contained large Nb particles. Several etches were used to bring out the structure. Some polished samples as well as broken wire fracture surfaces were examined in a JEOL 35 C Scanning Electron Microscope (SEM). Transverse wire sections were examined in a JEOL 200 CX TEM/STEM. TEM samples were prepared following a thinning technique. Critical current can be measured in several ways. Transport $J_c$ at 4.2k can be measured using either the barrel rig or the chip carrier rig. Either of these methods can be used depending on the available piece length. The barrel uses about 70 cm of material whereas the chip carrier uses 2 to 3 cm of material. Alternatively, $J_c$ may be calculated from the hysteresis in the magnetization loop using the Bean model. $T_c$ can be determined using a flux expulsion technique on a magnetometer, and $H_{c2}$ can be determined from where the loop closes on the magnetization trace.

Figure 2:
FIG. 2 is a photomicrograph at 100 magnification of a typical structure observed after the recrystallization/healing heat-treatment of the small diameter starting billet in accordance with the invention.
Figure 3:
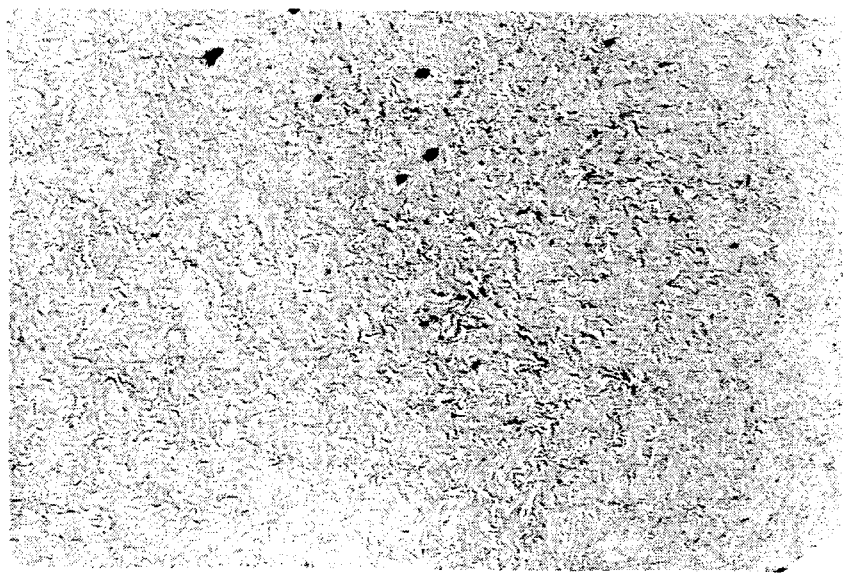
FIG. 3 is a photomicrograph at 100 magnification of a cross-section of a wire formed in accordance with the present inventions illustrating residual porosity observed in a sample taken near a wire break and Nb particles deforming into a chevron shape.

FIGS. 1 and 2 show the small sample microstructural development from sintering through the recrystallization/healing heat treatment. From these micrographs, the uniform distribution of Nb particles and the apparent lack of porosity after the recrystallization heat treatment are notable. Where wire breaks occur, residual porosity is a likely cause of failure. FIG. 3 shows a sample during the wire drawing process which showed residual porosity near the filament core. This figure also shows how the Nb particles develop into a chevron morphology during the wire drawing process. The development of the chevron-shaped grains (the matrix also develops this structure) has been previously observed in many BCC alloys. Such materials deform in plane strain during wire drawing. As the external constraints require the wire to conform to the die, the grains are forced to curl back on top of one another as the wire is strained, and hence the Nb particles (and Nb-Ti grains as well) deform into a chevron shape.

Figure 4:
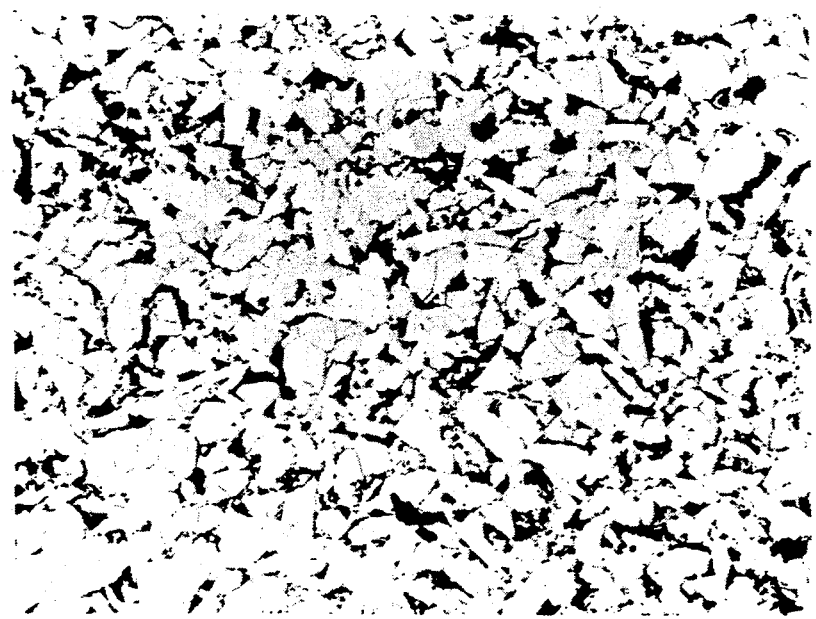
FIG. 4 is a photomicrograph at 100 magnification of a cross-section of a typical structure observed in an as-sintered material from the large diameter billet in accordance with the present invention.
Figure 5:
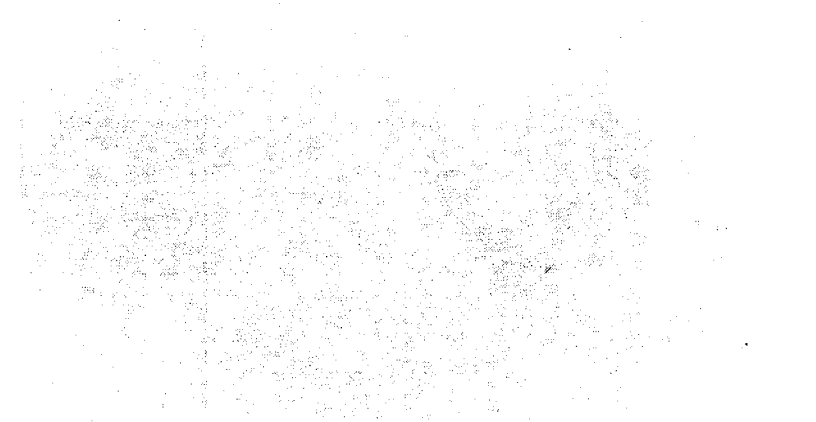
FIG. 5 is a photomicrograph at 100 magnification of a cross-section of a typical structure observed after the recrystallization/healing heat-treatment of the large diameter billet in accordance with the present invention.
Figure 6:
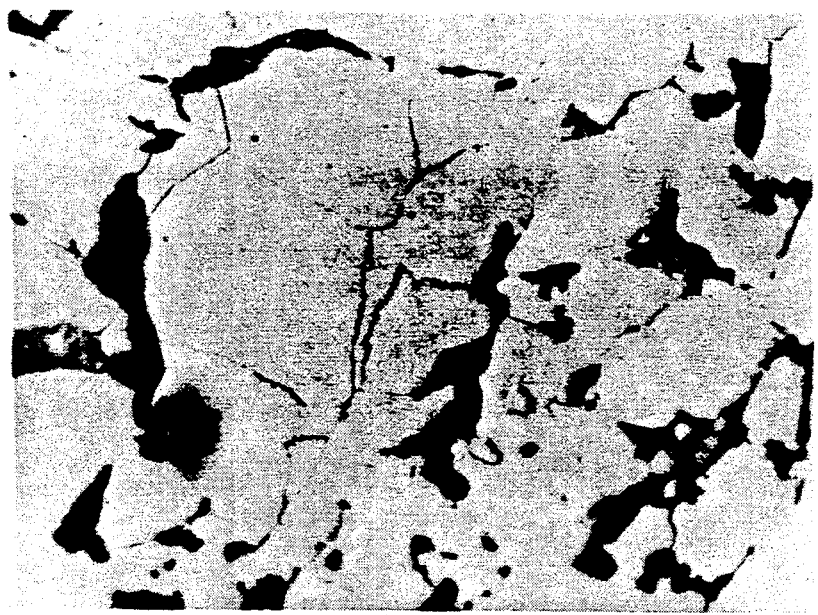
FIG. 6 is a photomicrograph at 500 magnification of a cross-section of the billet of FIG. 5 after sintering showing the titanium rich grain boundary precipitates.
Figure 7:
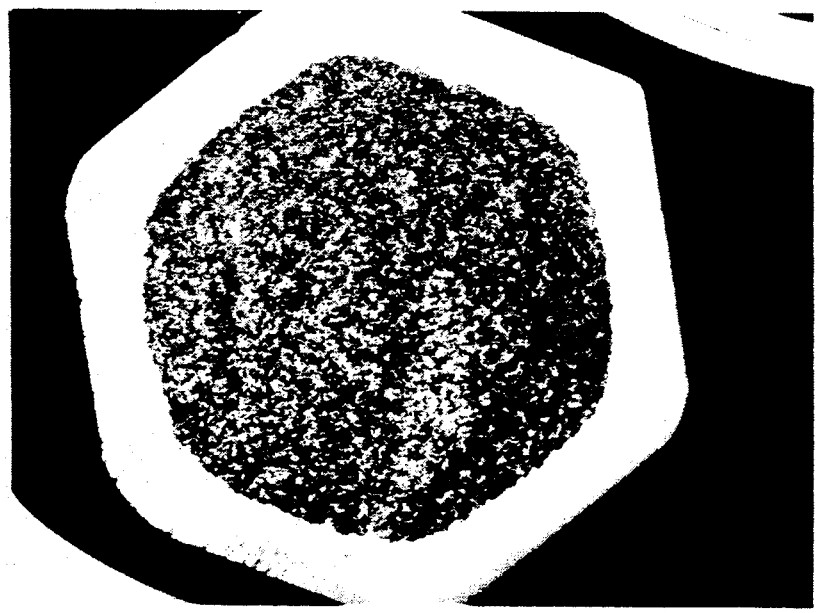
FIG. 7 is a photomicrograph at 50 magnification of a cross-section of a wire formed in accordance with the present invention from the large diameter billet material showing typical microstructure thereof.
Figure 8:
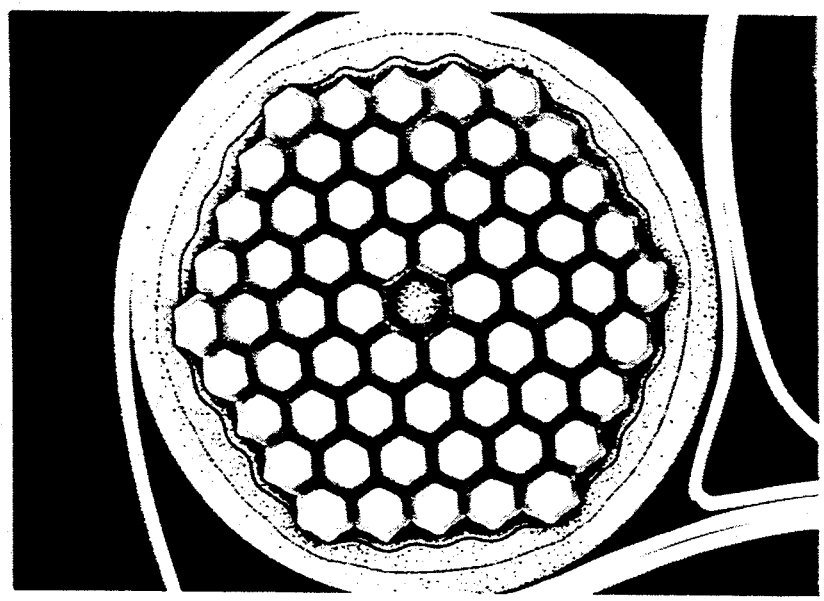
FIG. 8 is a photomicrograph at 25 magnification of a cross-section of an overall composite conductor before restacking in Cu-Ni where the composite is formed from the large billet material.
Figure 9:
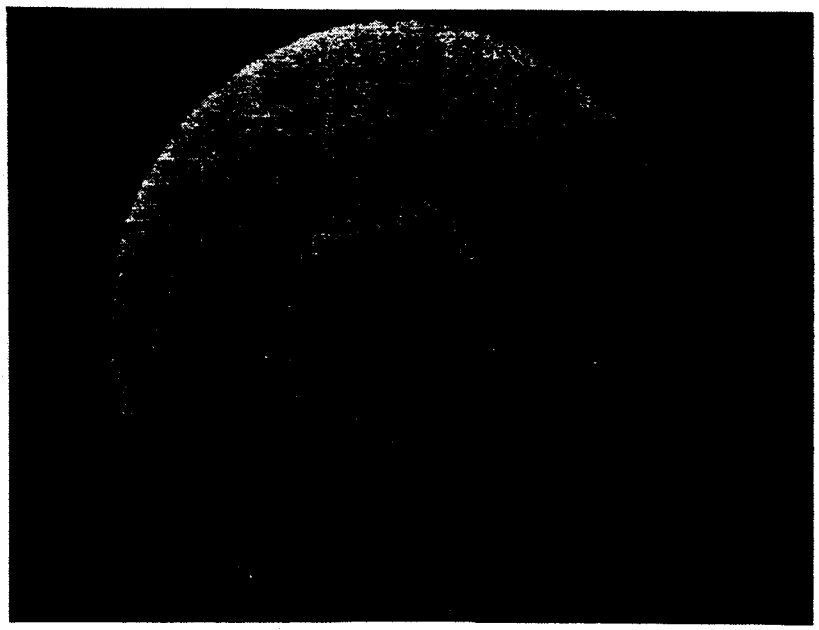
FIG. 9 is a photomicrograph at 500 magnification of a cross-section of typical structure in a composite at test size formed from the large diameter billet.

FIGS. 4 and 5 show the large billet sample microstructural development from sintering through the recrystallization/healing heat-treatment. It is noted that there is more porosity in the as-sintered large billet (as shown in FIG. 4) versus the small billet (FIG. 1). The large billet sample had larger starting particle sizes—100/+325 mesh Nb-Ti (45 microns to 150 microns) and −200/+325 mesh Nb (45 microns to 75 microns) versus −325 mesh Nb-Ti (45 microns) and −325 mesh Nb (45 microns)—, and slower heat-up rate in the large billet versus the small billet, both of which result in slower sintering kinetics. The large billet was sintered in a high vacuum while the small billet was produced under a process which incorporated a residual argon pressure of about 200 torr. Vacuum processing in the large billet mass appears to lead to a grain boundary $\alpha$-Ti precipitation, especially near the sample surface. The $\alpha$-Ti precipitation is shown in FIG. 6. However, there is no evidence for $\alpha$-Ti precipitates after the final recrystallization/healing treatment as shown in FIG. 5. FIG. 7 shows a general structure at the hex size, and the chevron morphology of the Nb particles is again evident. The deformation in the outer filaments and thinning of the Cu annulus is quite evident in a sample taken before the wire was recanned in Cu-Ni as shown in FIG. 8. The overall macro structure of the composite is shown in FIG. 9.

Filament hardness can be monitored to give an indication of the processability of the PM composites compared to standard ingot metallurgy (IM) material. FIG. 10 is a plot of hardness versus strain after the last recrystallization heat treatment for both large and small PM billets along with IM Nb-46.5 wt. % Ti material. While both PM materials are harder than the IM material, a vast improvement has been made in lowering the hardness of the large diameter billet material compared to the small diameter billet material. It may be noted that the hardening rate (i.e., the slope of the curve) of the IM material appears to be higher than that of the PM materials, at least initially.

FIG. 11 shows $J_{ct}$ at 5T as a function of strain for the small billet material. The highest $J_{ct}$ achieved in this material is slightly over 900 A/mm$^2$. However, the peak in $J_{ct}$ versus strain can be extended. The starting Nb powder particles were sieved through a 325 mesh screen (that is, were less than 44 microns in diameter). To estimate the final size of the particles, the particles can be assumed to be 40 microns spheres which are drawn down with the composite as cylinders. The results of such an estimate are shown at the top of FIG. 11. This technique can be utilized to estimate the strain ($\epsilon$) at which the Nb particle dimension matches that of the coherence length (coherence length at 4.2k=5 nm, $\epsilon$=18). This size matching can result in maximum pinning efficiency and therefore the maximum critical current. Such an estimate leads to a $J_{ct}$ at 5T of several thousand A/mm$^2$.

An exemplary detailed process for producing the small billet is as follows:

Powders are weighed out according to the desired proportion of Nb-Ti powder and a second powder which will function as the second phase. To determine the amount of material required to make the ingot, an estimate of the powder packing volume can be made by taking the as-poured or tap density from a Hall Flow Meter (ASTM B212 and B213), or else one-third the calculated powder composite density can be used as a first approximation. The powders should be adequately mixed without work-hardening the surface of the powders. The correct mixing action shears the surface layer of powder as the container is slowly rotated. Excellent results can be obtained simply by pouring the measured powders into a precleaned jar to a level of about 1/6 to slightly less than ½ full capacity. If the jar is too full or too empty, the desired mixing action will not occur. The desired mixing action should slowly rotate the jar end for end. After the different powders are no longer discernable, typically after 10 to 15 rotations, the jar is rotated on its axis for about 5 to 10 minutes. This completely mixes the two powders with little chance for subsequent separation unless the powders have vastly different characteristics, e.g., powder size or surface roughness.

In filling the bag, an aluminum foil liner in the bag greatly reduces powder/bag friction and provides for an easier, more complete bag filling. The foil is removed once the bag is filled. Tapping the filled bag on its end will produce a larger diameter final rod due to the higher initial packing density.

Figure 12:
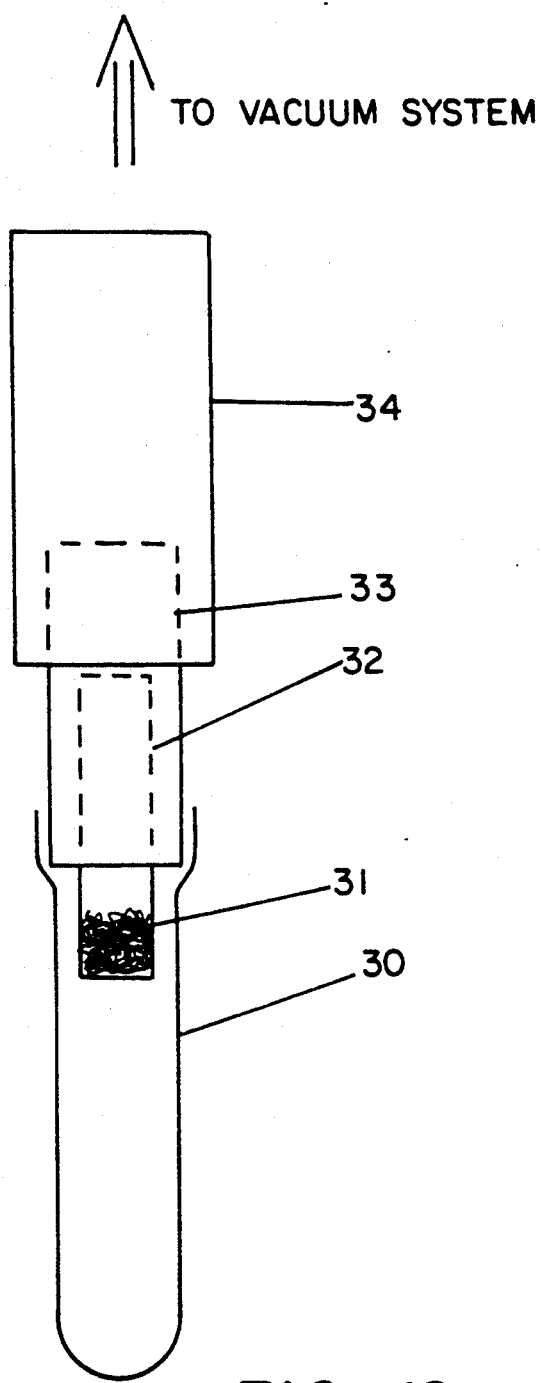
FIG. 12 is a simplified schematic view of the arrangement for evacuating the powder in the CIP bag wherein the inner Cu tube has a slip fit with the outer tube to prevent the powder from being sucked into the vacuum system.

The evacuation procedure provides several beneficial results related to the removal of atmospheric gases from the particle surfaces. A better as-pressed density is realized from the CIP operation since no trapped gas is available to resist the pressing operation. Also, it is easier to evacuate a green compact that was pre-evacuated because most of the gases have been evacuated through the larger pores present before pressing. The evacuation process involves slipping the end of the bag 30 over a double tube arrangement as shown in FIG. 12, with the inner internal tube 32 containing a filter 31 to prevent the powder from being sucked out during evacuation. The bag is fastened with a rubber band at the outer tube 33 which is connected to a high vacuum hose 34, and the bag with powder is alternately evacuated and back-filled with argon gas several times until the system reaches a vacuum of 10 torr. The system is maintained at this vacuum level for about 15 to 30 minutes before sealing and cold pressing. The procedure normally takes 1 to 2 hours. Leaving the powder in the bag for extended periods of time is, however, not advisable.

When a stable vacuum is reached, the bag is sealed in the following manner: the inner tube 32 is pushed into the outer tube 33; the flattened end of the bag 30 is twisted; a rubberband is tied around the twisted portion of the bag; a second rubberband is tied around the first; and the end of the bag is vented and removed from the copper tube; the end of the bag is flattened and double folded and tied fast with a rubberband, which is particularly effective with thicker CIP bags (30–40 mils) in keeping the powder in and the fluid out of the bag.

The sample in the bag is slipped into the Cu tube with a slotted stopper in the lower end (longitudinal slots in the stopper allow the fluid pressure to equalize at both ends of the sample). The sample is suspended by a wire and the stopper end of the tube rests on the bottom of the cage in the CIP chamber. This process limits sample bending during compaction and has produced straight samples in most cases. Sample bending or the elbow macaroni effect seems to worsen with repeated use of the bag. The sample is pressed to a pressure of 50 ksi.

After pressing, the bag is first thoroughly rinsed in water and dried with compressed air. Care is taken to completely dry the bag inside and out with removal of each rubberband. After the last rubberband is removed, the end of the bag is resecured with a rubberband leaving about an inch of airspace, preferably filled with argon gas, between the end of the bag and the sample. The bag is then carefully peeled away from the sample since the green compact has no ductility and minimal strength. The bag should not be peeled inside out or down over the sample. The half inch diameter bag is too thick at this size and it will only be possible to peel the bag so far, and then neither forwardly or backwardly.

Samples are sealed in quartz tubing after being wrapped in Nb foil in accordance with standard procedures. A complete wrapping with Nb foil is preferred to limit exposure to possible vapor deposition of various species in the tube. However, if the wrap is too tight, this will make evacuation more difficult. A good getter is an etched Hf rod loosely wrapped in Nb foil. Getters are used only once. A comparison of the elements with reactivity comparable to Ti and Nb oxides was made. Hf was identified as having the lowest P (partial pressure) and the highest M (molecular weight) and thus the lowest $J_{vap}$. Furthermore, use of a Ti getter results in Ti vapor deposits on exposed ingot metallurgy rod surfaces when compared to specimens which had the getter sealed away from the sample.

To be effective, the vacuum system needs to pump on itself for a couple of days before it is used. Samples are backfilled and evacuated several times to a vacuum level of about 10 torr or less. Once the system and sample are well pumped, the sample is switched over to a diffusion pump. In some runs, the can was sealed after reaching a constant vacuum level of $10^{-6}$ torr, however evacuating over night (or half a day) can lead to an even better vacuum level. The cold trap used did not have sufficient capacity to run unattended over night, but the system readily reaches the $10^{-7}$ torr range once the cold trap is filled with liquid nitrogen.

To enhance sintering, it is essential to take advantage of the stored free energy (surface energy) in the green compact. The best way to do this is to employ the most rapid heat-up possible. A preheated furnace which incorporates a thermal reservoir is one way of increasing the heat-up rate. Rapid heat-up results in more complete sintering and is especially important when sintering at or below $\frac{1}{2} T_{mp}$. With this in mind, the furnace is heated to the sintering temperature (the temperature reading at the sample is 1170°-1180° C., as read by Type K thermocouple and the set temperature is 1125°-1135° C. as read by Type R thermocouple outside the tube). The sintering time is 3 hours plus the 10 to 15 minute soak, depending on the furnace load. The sintering process incorporates flowing argon gas outside the can and cooling with flowing argon inside a stainless steel tube.

The as-sintered diameter of a compacted billet from a ½ inch bag is about 0.360 to 0.365 in. The standard process involves reduction in size and straining by swaging to a diameter of about 0.260 in., which seems to close residual porosity, although if agglomeration is gross, or sintering is poor, there is a slight possibility that some porosity may remain. The swaging process does produce some surface cracks even if it is done with flowing lubrication. The cracking condition is likely the result of the swag dies pinching the surface material, which is poorly sintered. The surface cracks are removed by first etching with a Magic Dip, as described below, to identify surface cracks, and grinding through the cracks with a flapper wheel grinder. Several cycles of etching and grinding successfully eliminated surface cracks.

The canning and heat-up procedure are the same as for the sintering process. The sample is heat treated for 2 hours at the same temperature and the cool down parameters are also the same as in the sintering process.

In the final steps, there is a final check for surface cracks, the sample billet is swaged around through one or two dies (swaged to 0.19 in. the last time), a second heat treatment is carried out which is a recrystallization/anneal at 800°-810° C. for 2 hours (same canning procedure) followed by a water quench. During scale-up it may be better to swage more the second time and to give it a full heat treatment in the case of agglomerate porosity. The required amount of deformation can be estimated by calculating the percentage reduction in area or the strain required to close porosity.

After the final steps, the proper size Cu can is selected, and this Cu can is etched in Cu bright dip. The rod is then etched in Nb-Ti etch, all the pieces are rinsed in distilled water and in methanol and dried with an air gun, and then the composite is drawn immediately with a minimum of 5 die passes before resting.

The Magic Dip etch consists of a mixture of hydrofluoric acid, nitric acid, and sulfuric acid, which are mixed in equal proportions. This acid mixture has no shelf life and will deteriorate quickly.

The niobium-titanium etch consists of water (e.g. 100 ml), nitric acid (70 ml), and hydrofluoric acid (e.g. 30 ml) which are mixed together in the order in which they are listed. This mixture has a capacity to be stored, although fresh solution is preferred.

The copper bright dip etch consists of water (e.g., 245 ml), sulfuric acid (217 ml), nitric acid (36 ml) and hydrochloric acid (1 ml). This mixture is best mixed with a water bath as the solution tends to boil slightly as the acids are mixed together.

The niobium barrier etch consists of water (e.g., 50 ml), hydrofluoric acid (25 ml), and nitric acid (25 ml), which are mixed in the order listed. This mixture has an excellent shelf life and has a good general Nb-Ti etch for structure.

The copper etch consists of water (e.g., 50 ml) and nitric acid (e.g., 50 ml), which has an excellent shelf life and has a good general copper etch.

As noted above, an exemplary arrangement for evacuating the powder in the CIP bag is shown in FIG. 12. The CIP bag 30 is connected to the copper tubes 32 and 33 leading to a high vacuum hose 34 extending to a vacuum system (not shown). A powder filter 31 in the inner tube 32 is held within the CIP bag. The inner copper tube 32 has a slip fit with the outer tube 33 to prevent the powder from being sucked into the vacuum system.

With regard to preparation of the large billet, much of the process is the same as that described above for the small billet. Several key features are changed to accommodate processing of billets from the larger bags (e.g., 1.5 in). The minimum billet length (about 5 in) requires about 500 grams in the larger bags.

In an example, a −325 mesh Nb-Ti powder is provided. Such powders can differ significantly in their characteristics. For example, the powder may be single grain versus polycrystalline, free flowing or not flowing, the powder particles may have various size distributions and varying susceptibility to pitting when etched with a homogeneity etch (the latter suggesting that the powder is not fully annealed), and the powder may be symmetric or asymmetric (e.g., with an aspect ratio of about 2:1). Of the characteristics mentioned above, the two most likely to cause problems during swaging are poor powder flow characteristics and the large aspect ratio of Nb powder. Excess particle friction or particle bridging may lead to random large void pockets which would resist closure and could result in complete failure. In addition, the irregular shape of the Nb powder can act to resist side contact, which would hinder sintering. All of these factors can be assumed to produce larger defects, in both size and number density, in the as-sintered compact.

The process is modified from the small billet process in the first instance in that there is an increase in size (for example, 0.5 in bags were filled with 50 grams of material, while the 1.5 in bags require 500 grams as a minimum). Bag handling is only slightly changed from the small billet samples. A hose clamp is used to secure the bag to the vacuum hose containing two copper tubes. The smaller, internal copper tube contains a filter and is used as an air path during evacuation. After evacuation, the small tube is slid into the large tube, allowing the bag to be twisted and tied off. Once the bag is removed from the vacuum system, the interior of the remaining bag end must be cleaned of residual metal powder. This is done with a microwipe wetted with methanol (not ethanol). It is found that it is particularly important to do this when using the −325 mesh powder because it will line the bag and provide a fluid path during pressing. The bag should be twisted and tied with a rubberband at a second location. The remaining end of the bag should be double folded and a rubberband tied to provide a third and final seal. The sample is warm when it comes out of the CIP, indicating that some cold work is occurring during compaction. The large quartz tubes (37 mm × 40 mm) are sealed using hydrogen and oxygen on a 4 valve/2 stage torch. A quartz can for these large samples is made by providing a closed "test tube" and by melting a smaller "holding" tube (about 1 foot long as a minimum) into one of the open ends. A 2-inch section of the tube is necked down going into the test tube end to facilitate collapse around the smaller tube (e.g., 17 mm × 19 mm). After cooling, the sample and getters are slid into the container and the back end of the tube is closed off to form a "test tube" end. When making the neckdown region it is acceptable to use a narrower flame and draw the quartz down thinner near the end as a length of thicker material is also melted onto the insert tube. However, when sealing off the second end, it is important to use a larger flame to flow the quartz more uniformly and avoid thinning of the wall thickness. A noisy flame is avoided which is an indication of excess oxygen pressure or flow, because it will usually result in a tubal blow-through condition. If the exhaust gas is going to either or both of the tubes, the gases will soon condense at the cooler end of the tube, and when enough moisture has condensed, it will run toward the flame, creating steam.

To obtain a steady vacuum, the sample is evacuated for a minimum of 10 hours, with the last 2 hours operated with a full cold trap. Typical vacuums obtained are on the order of $2 \times 10^{-6}$ torr. It is essential that the vacuum be steady for a long while before sealing (indicating equilibrium) and that the vacuum not fall once the sample is sealed away from the vacuum system. It is desirable to have a vacuum system with a high throughput and preferable that rubber components of the system be replaced where possible with metal components to improve the evacuation system.

The large billet size requires that the billet be placed in a furnace preheated to only about 800° C. and the temperature then raised in 100° C. increments every 15 minutes or so until the sintering temperature of 1175° C. is reached. The sample is heat treated with flowing argon surrounding the quartz. Slow heat-up allows the getters time to do their job. The quartz is very clean after sintering in contrast to the blackening/blueing that occurs on smaller samples that were rapidly heated. An adverse kinetic effect may be that some of the stored energy (in the form of surface energy and strain energy) may be annealed out during the long heat-up time, resulting in less efficient densification. After sintering, the furnace is turned down to 800° C. and the sample is allowed to cool in the furnace for about an hour. The sample is then pulled out and placed in a stainless steel tube and allowed to cool for another two hours or more under flowing argon. The sample/quartz combination may be pulled out of the stainless steel tube, but it must be allowed to cool overnight. The complete process from blending of the powders to producing as-sintered compact ready for swaging, takes about three days.

An exemplary comparison of the swaging of the large billet to the small billet is shown in Table 2 below. The small billet is strained by ¾ the amount that the large billet is strained through the first die pass. Viewed in another way, the total radius reduction on the smaller billet is equal to one die pass on the large billet. This radius reduction is the key parameter when considering a local strain or strain rate in the vicinity of a pore, which is much different than the average value.

TABLE 2

| | Swage Size Comparison | | |
|---|---|---|---|
| d° | swage die sizes | ε | radius change |
| 1.150 | 1.030 | 0.22 | 0.060 |
| | 0.930 | 0.20 | 0.050 |
| | 0.840 | 0.20 | 0.045 |
| | 0.750 | 0.23 | 0.045 |
| | | 0.85 | 0.200 |
| 0.360 | 0.334 | 0.15 | 0.014 |
| | 0.308 | 0.16 | 0.013 |
| | 0.284 | 0.16 | 0.012 |
| | 0.260 | 0.18 | 0.012 |
| | | 0.80 | 0.051 |

A Nb-Ti first phase and a Nb second phase system is a true two-phase mixture. Nb has different mechanical properties than the Nb-Ti alloy and, in addition, may not be as well sintered as the surrounding matrix. As a result, cracks can form through pores near the Nb particles and in the matrix. With regard to the mechanics of a billet cracking within a Cu tube, it is noted that the tube never bonds to the billet. As a result, the billet may shift within the copper tube, allowing a crack to form. Since the surface crack is a gap in the billet surface and since copper has lower strength and higher ductility than the billet, some of the copper will be forced into the cracks during swaging. Additional swaging will force the crack to open further by means of thermal expansion of the copper in the crack due to the good thermal conductivity of the copper. Swaging also forces more copper into the crack. Initial crack formation generally originates at a pore. When an external radial pressure is applied to the ingot, a compressive force results on the pore in the radial direction while a tensile force is resolved in the axial direction. In addition, there is a high surface friction which results in a torsional shear stress. This shear stress can be the overwhelming factor as the cracks observed spiral around the diameter of the sample to some extent. The surface friction is related to the feed rate, strain, surface velocity, and lubrication. The material surrounding the pore undergoes tremendous strains upon closing, while the surrounding material is essentially unstrained because most of the deformation was accommodated by the region surrounding the pore. The net result is that a closed pore incorporates highly work hardened material surrounded by only slightly strained material. Furthermore, the pore walls are not metallurgically bonded and therefore cannot transmit stresses and strains efficiently.

During swaging, the sample densifies on the outside first, sealing the sample from external contaminants except those which may enter from the ends. Thus, swaging dry may allow for self-canning, but the sample must go through several dies. Alternative methods include arc melting or RF melting of the sample surface, or depositing a continuous layer. Extruding can also be utilized to reduce the diameter of the billet, facilitating further reduction in size.

It is understood that the invention is not confined to the particular processes and embodiments set forth herein as illustrative, but embraces such modified forms thereof as come within the scope of the following claims.

What is claimed is:

1. A superconducting wire structure comprising:
   a matrix comprising body centered cubic niobium-titanium alloy with a second phase of discrete metal inclusions compatible with niobium-titanium providing artificial pinning centers distributed therein, at least some second phase inclusions having sizes in the range of 1 to 10 nm, the second phase comprising between 5 to 50% by volume of the total matrix and second phase, wherein the second phase is selected from the group consisting of niobium, vanadium, tantalum, hafnium, zirconium, titanium, tungsten, molybdenum, chromium, copper, silver, gold and alloys thereof, and wherein the wire structure is formed by deforming and drawing a billet comprising a mixture of a first phase powder comprising the body centered cubic niobium-titanium alloy with a second phase powder of the metal compatible with niobium-titanium, the second phase comprising from 5% to 50% by volume of the mixture, the mixture pressed and sintered to provide a bond between the powder particles without significant diffusion of the second phase into the first phase or significant diffusion of the first phase into the second phase.

2. The superconducting wire structure of claim 1 wherein the second phase is niobium.

3. The superconducting wire structure of claim 1 further including a cladding of a normal conductor which is a good conductor of electricity and heat around the matrix.

4. The superconducting wire structure of claim 3 wherein the normal conductor is selected from the group consisting of copper and copper alloy.

5. The superconducting wire structure of claim 1 wherein the alloy of the matrix is in the range of Nb20 wt. % Ti to Nb70 wt. % Ti.

6. The superconducting wire structure of claim 1 wherein the composition of the matrix body centered cubic niobium-titanium alloy is Nb46.5 wt % Ti.

7. A superconducting wire structure comprising:
   a matrix comprising body centered cubic niobium-titanium alloy with a second phase of discrete niobium inclusions providing artificial pinning centers distributed therein, at least some second phase inclusions having sizes in the range of 1 to 10 nm, the second phase comprising between 5 to 50% by volume of the total matrix and second phase, wherein the wire structure is formed by deforming and drawing a billet comprising a mixture of a first phase powder comprising the body centered cubic niobium-titanium alloy with a second phase powder of niobium, the second phase comprising from 5% to 50% by volume of the mixture, the mixture pressed and sintered to provide a bond between the powder particles without significant diffusion of the second phase into the first phase or significant diffusion of the first phase into the second phase.

8. The superconducting wire structure of claim 7 further including a cladding of metal selected from the group consisting of copper and copper alloy around the matrix.

9. The superconducting wire structure of claim 7 wherein the alloy of the matrix is in the range of Nb20 wt. % Ti to Nb70 wt. % Ti.

10. The superconducting wire structure of claim 7 wherein the composition of the body centered cubic niobium-titanium alloy is Nb46.5 wt % Ti.

11. A powder metallurgy billet which may be processed to reduce the size of the billet and draw the material of the billet into a superconducting wire, comprising:
    a mixture of a first phase powder comprising a body centered cubic niobium-titanium alloy with a second phase powder of a metal compatible with niobium-titanium, the second phase comprising from 5% to 50% by volume of the mixture, the mixture pressed and sintered to provide a bond between the powder particles without significant diffusion of the second phase into the first phase or significant diffusion of the first phase into the second phase, wherein the second phase is selected from the group consisting of niobium, vanadium, tantalum, hafnium, zirconium, titanium, tungsten, molybdenum, chromium, copper, silver, gold and alloys thereof.

12. The powder metallurgy billet of claim 11 wherein the second phase is niobium.

13. The powder metallurgy billet of claim 11 wherein the alloy of the first phase is in the range of Nb20 wt. % Ti to Nb70 wt. % Ti.

14. The powder metallurgy billet of claim 11 wherein the composition of the alloy of the first phase is Nb46.5 wt % Ti.

15. The powder metallurgy billet of claim 11 wherein the size of the first phase powder is in the range of 45 microns to 150 microns and the size of the second phase powder is in the range of 45 microns to 75 microns.

16. The powder metallurgy billet of claim 11 wherein the size of the first and second phase powders is less than 45 microns.

* * * * *